United States Patent
Smith et al.

(10) Patent No.: US 7,642,833 B1
(45) Date of Patent: Jan. 5, 2010

(54) DELAY INVERSELY PROPORTIONAL TO TEMPERATURE TIMER CIRCUIT

(75) Inventors: Chris Smith, Essex Junction, VT (US); Dave Chapman, Shelburne, VT (US); Tim Fiscus, South Burlington, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 290 days.

(21) Appl. No.: 10/802,977

(22) Filed: Mar. 16, 2004

Related U.S. Application Data

(60) Provisional application No. 60/456,491, filed on Mar. 20, 2003.

(51) Int. Cl.
*H03H 11/26* (2006.01)

(52) U.S. Cl. .................. 327/281; 327/262; 327/288

(58) Field of Classification Search ............. 327/261, 327/262, 276–278, 281, 284, 285, 288
See application file for complete search history.

(56) References Cited

U.S. PATENT DOCUMENTS

| | | | | |
|---|---|---|---|---|
| 5,175,452 A | * | 12/1992 | Lupi et al. ................ | 327/262 |
| 5,446,417 A | * | 8/1995 | Korhonen et al. ......... | 331/57 |
| 5,731,725 A | * | 3/1998 | Rothenberger et al. .... | 327/262 |
| 5,926,045 A | * | 7/1999 | Kwon ........................ | 327/114 |
| 5,994,937 A | * | 11/1999 | Hara et al. ................. | 327/262 |
| 6,031,366 A | * | 2/2000 | Mitsuishi .................. | 323/315 |
| 6,388,490 B2 | * | 5/2002 | Saeki ........................ | 327/270 |

* cited by examiner

*Primary Examiner*—Quan Tra

(57) ABSTRACT

A timer circuit is disclosed. The timer, having a delay configured to track inversely with temperature of the memory device, includes a reference signal configured to increase in voltage, as the temperature of the memory device increases. The reference signal may be generated from a current that is derived from a bandgap reference circuit. The timer circuit includes a pull-down path made up of a plurality of selectable pull down transistors which are coupled to the reference signal at the gate. Resistance of the pull-down path is reduced as the reference signal is increased and the reduced resistance of the pull-down path decreases the delay of timer. A plurality of selectable delay elements may be preconfigured to adjust the delay and are coupled to the output path of the current starved inverter.

20 Claims, 5 Drawing Sheets

DELAY INVERSELY PROPORTIONAL TO TEMPERATURE TIMER CIRCUIT

RELATED U.S. APPLICATION

This Application claims priority to the copending provisional patent application Ser. No. 60/456,491, entitled "INVERSELY PROPORTIONAL TO TEMPERATURE TIMER CIRCUIT," with filing date Mar. 20, 2003, assigned to the assignee of the present application, and hereby incorporated by reference in its entirety.

BACKGROUND OF THE INVENTION

1. Field of the Invention

The present invention relates to the field of timer circuits. More particularly, the present invention relates to a method and architecture for a timer circuit having a delay that is inversely proportional to temperature.

2. Related Art

There are a number of timer circuits known in the art that are applied in circuits that require an intentional delay for timing coordination. Most of these applications have a timing delay that changes proportional to changes in temperature. One common application of such a timer is in a basic ring oscillator circuit. Many applications, however, require a circuit having a delay that does not vary appreciatively with process, voltage or temperature. Examples of such applications are command timers, command cycle timers and deep sleep mode timers.

Conventional Art FIG. 1 illustrates an example of such a conventional timer circuit 100, a VNBIAS Timer. This is a deep sleep mode timer that includes metal trim options. These types of timers receive a reference level, such as VNBIAS, that may be generated from a bandgap reference circuit on a chip. In this approach, the current through the leg in the bandgap reference circuit (not shown) sets the VNBIAS reference voltage 105 and this current may be mirrored into the pull-down path 120 of the timer 100. The corresponding NMOS 122 (with VNBIAS at the gate) is typically sized to control the current through leg 120. To create a faster or slower delay in the timer 100, NMOS type gate-capacitors 130a, 130b and 130c can be selectively added or removed as metal trim options to enable more or less capacitance on the output node of the current starved inverter, thereby increasing or decreasing the delay time of circuit 100. During operation, this approach produces a constant delay based on the capacitor loads and requires designing for a worst-case delay with no real-time adjustment for temperature variations or other environmental effects that may impact the delay time of the chip.

Certain timers, such as write back timers, wordline timers, sense amp set to CSL timers and refresh oscillators have further complications that render the conventional timers inadequate. For example, because the strap resistance between the deep trench capacitor and the pass gate in a 1T memory cell is more resistive at lower temperatures and less resistive at higher temperatures, write back into the cell needs to be longer at low temperatures and shorter at high temperatures. Also due to the strap resistance, in order to get enough signal margin so that sense amps can read the value in the cell, the wordline to set time needs to be on longer for lower temperatures and shorter for higher temperatures. Because the threshold voltages (VTs) of the pass gates to the sense amps and the cross-coupled nfet and pfet pairs of the sense amp get higher with lower temperature, the sense amp takes longer to set. Therefore the sense amp set to CSL time needs to be longer for lower temperatures than for higher temperatures. Also, the retention time of the 1T memory cell is shorter at higher temperatures and longer at lower temperatures. Therefore, the memory cells need to be refreshed more frequently at higher temperatures and less frequently at lower temperatures.

SUMMARY OF THE INVENTION

Accordingly, embodiments of the present invention provide a circuit and timing/delay method for varying a delay in a timing device inversely to changes in the temperature of the timing device. The timer, having a delay configured to track inversely with temperature of the timing device, includes a reference signal configured to increase in voltage as the temperature of the timer device increases. The reference signal may be generated from a current that is derived from a bandgap reference circuit in accordance with one embodiment. In one embodiment, the timer circuit may be used in a memory device.

In one embodiment, the novel timer circuit includes a pull-down path that includes a plurality of parallel coupled transistors which are coupled to the reference signal. Resistance of the pull-down path is reduced as the reference signal is increased and the reduced resistance of the pull-down path decreases the delay of timer. Furthermore, the number of parallel coupled paths may be real-time selected by configurable pass gates. The more paths introduced, the more current through the pull-down path and the faster the timer operates.

In addition, timer circuit 305 includes a plurality of configurable capacitor elements on the output node of the current starved inverter. These capacitors may be selected in real-time by programming pass gates. In addition, some may be selected by metal trim options. The more capacitors introduced, the slower the timer circuit operates.

Therefore, the novel timer circuit may have its delay adjusted by selectively introducing capacitance and pull-down current. Moreover, once the timer circuit is configured by the programmable pass gates, its delay continues to be adjusted according to variations of the VPTAT reference signal, e.g., the delay is inversely proportional to the chip temperature.

BRIEF DESCRIPTION OF THE DRAWINGS

The accompanying drawings, which are incorporated in and form a part of this specification, illustrate embodiments of the invention.

Conventional Art

DETAILED DESCRIPTION OF THE EMBODIMENTS

In the following detailed description of the embodiments, numerous specific details are set forth in order to provide a thorough understanding of the present invention. However, it should be recognized by one skilled in the art that the present invention may be practiced without some specific details or with equivalents thereof. In other instances, well-known methods, procedures, components, and circuits have not been described in detail as not to unnecessarily obscure aspects of the embodiments.

Figure 1:
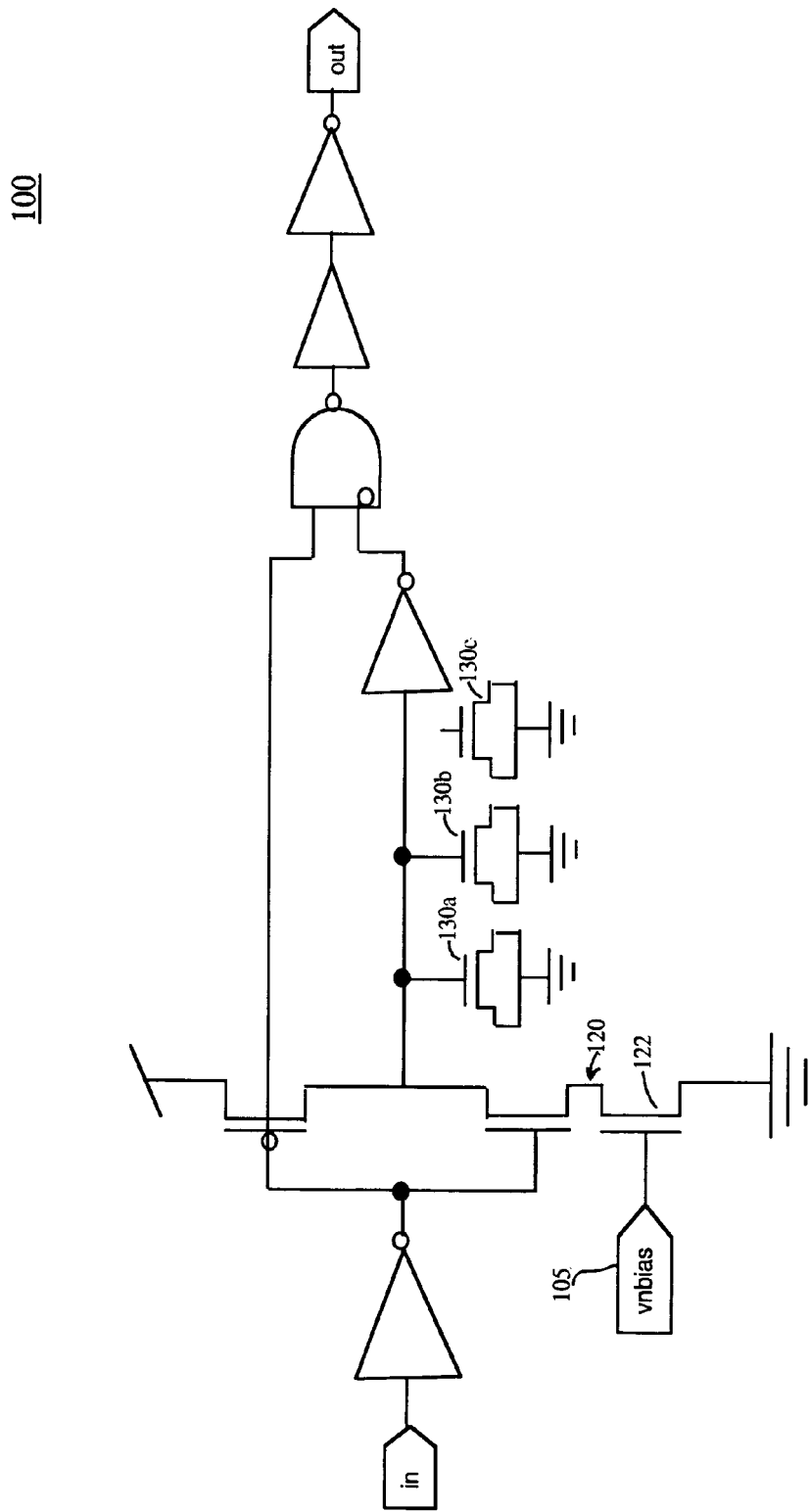
FIG. 1 is a block diagram of a conventional timer circuit.
Figure 2:
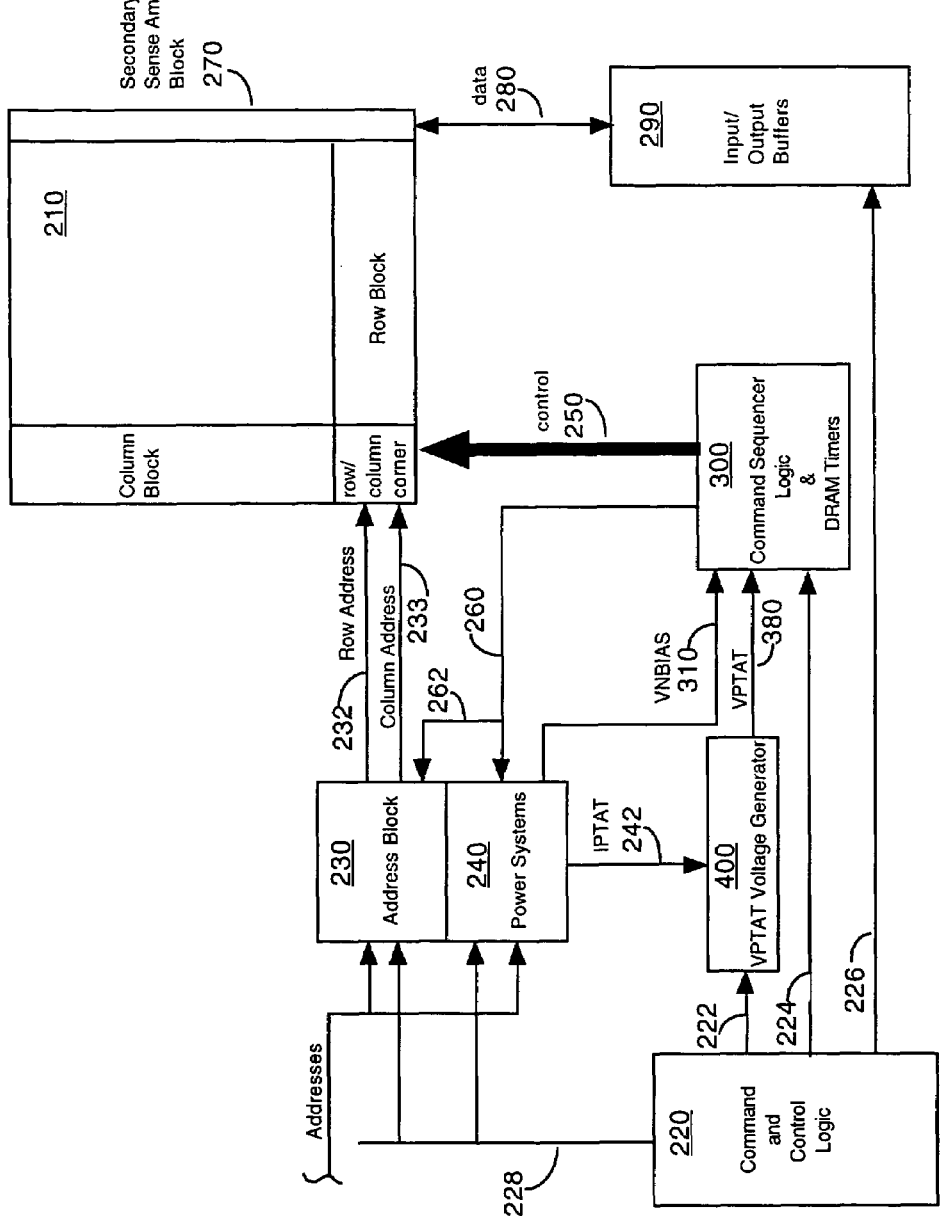
FIG. 2 is a block diagram illustrating a memory device comprising a DRAM cell with a timer circuit having a delay that is inversely proportional to temperature in accordance with one embodiment of the present invention.

Accordingly, embodiments of the present invention provide a device and method for varying inversely the delay in the operation of a timer circuit responsive to changes in temperature. Although the novel timer circuit can be used in any circuit architecture, in one exemplary embodiment the timer circuit may be used in a memory device. Therefore, FIG. 2 illustrates one exemplary application of the novel timer circuit in accordance with one embodiment of the present invention. FIG. 2 is a block diagram illustrating an exemplary memory device 200 comprising a dynamic random access memory (DRAM) cell 210 with timers 300 that have a delay that is inversely proportional to temperature in accordance with one embodiment of the present invention.

According to one embodiment, command and control logic 220 may provide signals 228 to address block 230 and power systems 240, signal 222 to voltage generator 400 to control the various functions associated with memory device 200. Power systems 240 (including a bandgap reference circuit) may send a proportional-to-temperature current signal, IPTAT 242, to voltage generator 400 which, in turn, sends a proportional-to-temperature voltage signal, VPTAT 380, to timers 300. Power systems 240 may also send a reference voltage signal, VNBIAS 310, to timers 300. The timers 300 generate clocking control signals 250 having a delay that is inversely proportional to temperature for controlling the access of the memory core 210. Timers 300 may include a write back timer, a wordline timer, a sense amp set to CSL timer and a refresh oscillator, for instance. One or more of these timers utilize the novel timer circuit architecture of the present invention that is described in detail below in FIG. 3. Voltage generator 400 is described in FIG. 4.

Figure 3:
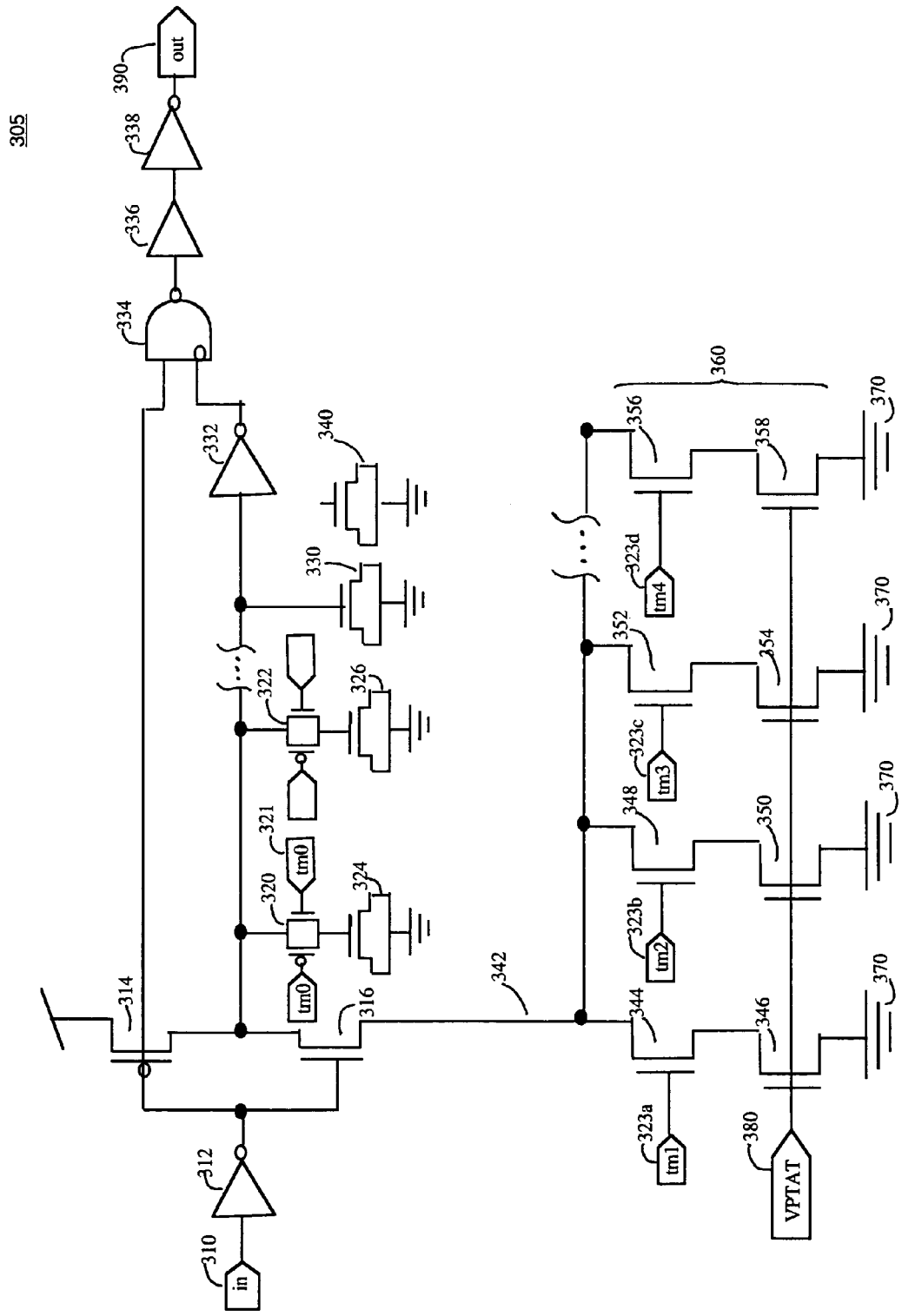
FIG. 3 is a block diagram of a timer circuit having a delay that is inversely proportional to temperature in accordance with one embodiment of the present invention.

FIG. 3 is a block diagram of a timer circuit 305 in accordance with an embodiment of the present invention. The circuit 305 provides a delay that is inversely proportional to absolute temperature (IPTAT) of the timer circuit. In one embodiment, the circuit 305 may be configured within timers and osillators to generate a delayed signal in a memory cell (e.g., memory cell 200 of FIG. 2) that varies inversely to temperature changes within the memory cell.

The input signal to circuit 305 enters at input 310 through inverter 312 and exits at output 390, according to one embodiment of the present invention. A reference voltage, VPTAT 380, may be generated by a proportional to temperature voltage circuit such as is described in FIG. 4. The circuit 305 includes a pull up transistor 314, a transistor 316, one or more pairs of selectable pull down transistors such as transistor 344 and transistor 346, transistor 348 and transistor 350, transistor 352 and transistor 354, and transistor 356 and transistor 358. The pull down pairs each functioning to increase the pull down current when introduced into the circuit. These selectable pull down transistors are introduced into the pull down path by respective control bits 323a-323d. The gate of each selectable pull down transistor is also coupled to VPTAT signal such that its operation varies according to temperature.

Circuit 305 may also comprise one or more selectable capacitors 324 and 326 having programmable passgates 320 and 322, respectively, and metal option and/or fixed capacitors such as capacitor 330 and capacitor 340 that may be added or removed to adjust a delay of the signal in circuit 305. These capacitors are coupled to the output path of the current starved inverter along with inverter 332, nand gate 334, having low asserted input, buffer 336 and inverter 338.

In addition to the circuit delay of timer 305 being responsive to the VPTAT signals, there may be a number of trim option signals, e.g., tm0 321, tm1 323a, tm2 323b, tm3 323c and tm4 323d, for programming the delay of circuit 305 according to an embodiment of the present invention. For instance, signal tm0 321 may control a CMOS passgate 320 so as to enable capacitive element 324 on the output node. If tm0 321 is high to enable the passgate, then the delay will be increased. The same is true for capacitor 326 and passgate 322 which can be used for added capacitance. It should be understood that other delay control as well as other capacitive and/or delay elements, e.g., metal option capacitors 330 and 340 could be used. It is appreciated that gates 320 and 322 can be configured electronically and controlled by memory cells while the metal option capacitor 340 is configured, typically, at manufacturing.

Additionally, at the pull down path, tm1-tm4 323a-323d signals can be applied to respective NMOS transistors 344, 348, 352 and 356 that can be connected in series to those transistors receiving the VPTAT 380 signal in accordance with one embodiment of the present invention. These tm1-tm4 323a-323d signals may be memory cell controlled and, when high, can enable an associated path (e.g., overall pull-down leg 360) to essentially increase the overall current that the pull-down path 342 can discharge to ground at 370. Introducing more pull down paths acts to decrease the overall delay of the circuit. Likewise, reducing the number of pull down path transistors reduces the overall pull down current and slows the timer circuit 305. Signals tm0 321 and tm1-tm4 323a-323d may be derived from any memory cell type, such as from a specific test mode, from fuse programming, from bond options, from metal options, from a standard circuit mode or any of the signals could be replaced by metal option, for instance. It is appreciated that timer circuit 305 provides a delay that is inversely proportional to temperature in addition to the delay options that are provided via control bits tm0-tm4 and metal option control that is provided.

Thus, according to one embodiment, circuit 305 may be programmed in a test or configuration mode, prior to operation, for a desired fixed delay using an addition or reduction of capacitance to increase or decrease the delay, respectively, and/or an addition or deletion of pull-down legs to increase or decrease the current through the pull-down path 342, thereby reducing or increasing the delay, respectively. Then, once operational, the VPTAT signal 380 will increase the delay with decreasing temperatures and decrease the delay with increasing temperatures to maintain the same general tracking characteristics during environmental changes, e.g., temperature. In operation, as temperature increases, the VPTAT voltage signal 380 increases proportionally and this tends to increase pull down current through the selected transistors 346, 350, 354, 358, etc. This reduces the delay through circuit 305. As temperature decreases, the voltage VPTAT decreases and the pull down current decreases which increases the delay of circuit 305.

Circuit 305 may provide a timer circuit having a delay that is inversely proportional to temperature and that is suitable for use in a write back timer, a wordline timer, a sense amp set to CSL timer and a refresh oscillator, for instance, and any other application needing a timing device that has an inversely proportional to absolute temperature (IPTAT) delay.

Figure 4:
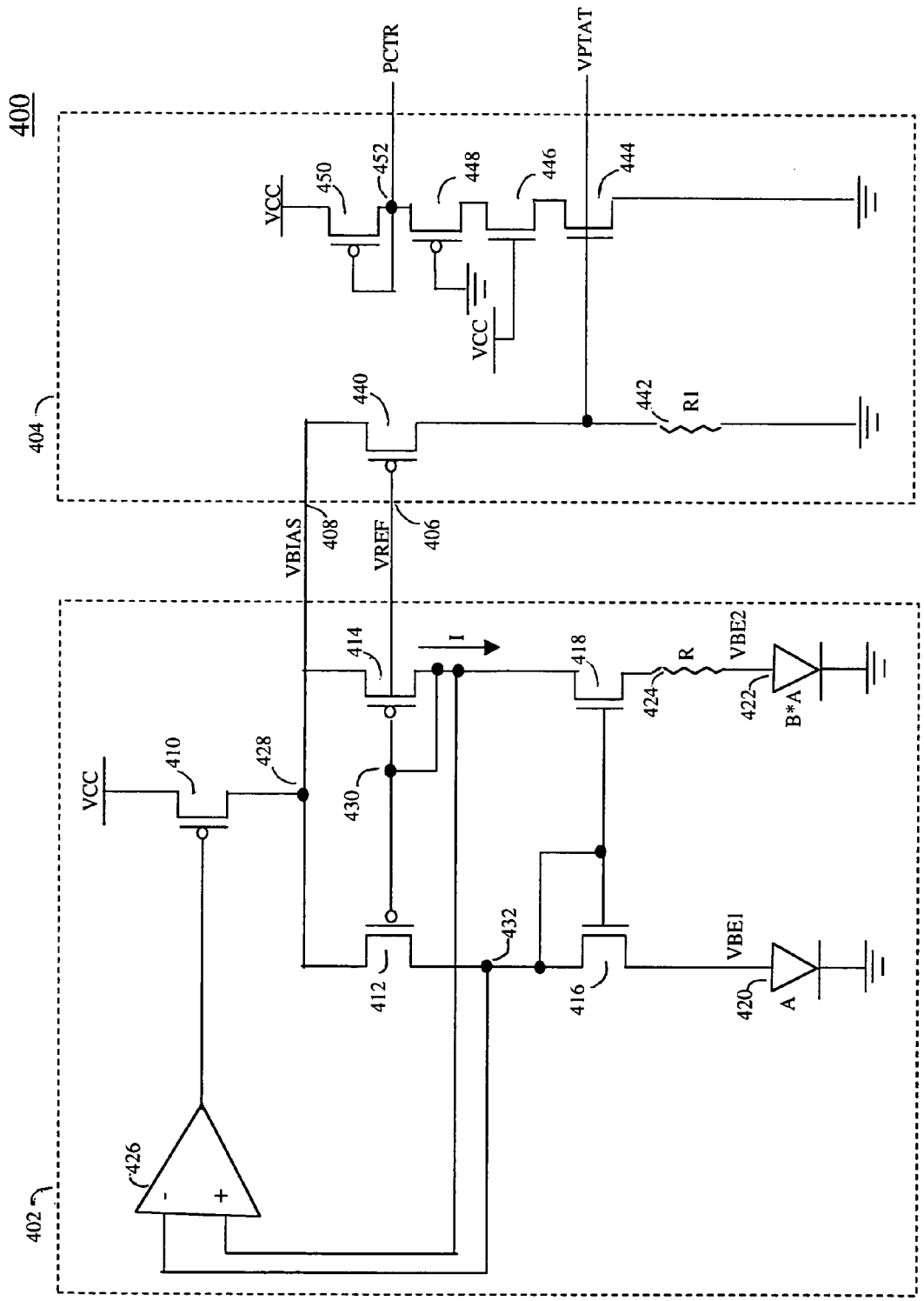
FIG. 4 is a block diagram of a proportional to temperature voltage generator for use with a timer circuit in accordance with one embodiment of the present invention.

FIG. 4 is a block diagram of a proportional to temperature voltage generator for use with a timer circuit in accordance with one embodiment of the present invention. FIG. 4 is described in U.S. Pat. No. 6,628,558 B2, entitled Proportional to Voltage Generator, issued on Sep. 30, 2003, by Timothy E. Fiscus, and is incorporated herein by reference.

Referring now to FIG. 4, a block diagram of a circuit 400 is shown in accordance with one embodiment of the present invention. The circuit 400 may be implemented as a proportional to temperature voltage generator circuit. The circuit 400 generates a first voltage signal (e.g., VPTAT) and a second voltage signal (e.g., PCTR) that may be proportional to absolute temperature (PTAT). Circuit 400 comprises a circuit 402 and a circuit 404. The circuit 402 may be implemented as a PTAT current source circuit. The circuit 404 may be implemented as a PTAT voltage reference circuit. The circuit 402 generates a temperature dependent reference signal (e.g., VREF) and a bias signal (e.g., VBIAS). The signal VREF varies linearly with temperature. The signal VREF is supplied to an input 406 circuit of the circuit 404. The signal VBIAS is supplied to an input 408 of the circuit 404. The circuit 404 generates the signals VPTAT and PCTR in response to the signal VREF and the signal VBIAS. The signal PCTR may be a mirror of the signal VPTAT.

The circuit 402 comprises a transistor 410, a transistor 412, a transistor 414, a transistor 416, a transistor 418, a device 420, a device 422, a device 424, and an amplifier 426. The transistors 410-414 may be implemented as one or more PMOS transistors. The transistors 416 and 418 may be implemented as one or more NMOS transistors. However, other types and/or polarity of transistors may be implemented accordingly to meet the design criteria of a particular application. The devices 420 and 422 may be implemented as base-emitter junction devices (e.g., diodes, diode-connected transistors, etc.). In one embodiment, the devices 420 and 422 may be implemented as forward biased diodes. The device 420 has an area A. The device 422 has an area that is B times A, where B is an integer. The device 424 is a resistive circuit. In one example, the device 424 may be implemented as a resistor having a predetermined resistance R. The amplifier 426 may be implemented as an operational amplifier circuit.

The transistors 412-418 and the devices 420-424 may be configured as a delta Vbe generator circuit. A source of the transistor 410 is connected to a supply voltage (e.g., VCC). A node 428 is formed by coupling a drain of transistor 410 with a source of transistor 412 and transistor 414. The signal VBIAS may be presented at the node 428. A node 430 is formed by coupling a gate of the transistor 412, a gate and drain of transistor 414, and a drain of transistor 418. A source of transistor 416 is coupled to a first terminal of device 420. A second terminal of device 420 is coupled to a voltage supply ground potential (e.g., VSS). A source of transistor 418 is coupled to a first terminal of device 424. A second terminal of device 424 is coupled to a first terminal of device 422. A second terminal of device 422 is connected to the voltage supply ground potential VSS. The first terminals of the devices 420 and 422 may be connected, in one example, to anodes of the devices 420 and 422. The second terminal of the devices 420 and 422 may be connected, in one example, to cathodes of the devices 420 and 422.

A first input (e.g., a non-inverting input) of the amplifier 426 is coupled to node 430. A second input (e.g., an inverting input) of amplifier 426 is coupled to node 432. An output of amplifier 426 generally forces a current (e.g., I) through the transistors 412 and 416 to be the same as a current through the transistors 414 and 418. The current I may be described by the following equation 1:

$$Vbe1 = Vbe2 + I \cdot R \qquad \text{Eq. 1}$$

$$I = \frac{\Delta Vbc}{R} = \frac{n \cdot Vt \cdot \ln(B)}{R}$$

The circuit 404 comprises a transistor 440, a device 442, a transistor 444, a transistor 446, a transistor 448 and a transistor 450. The transistors 440, 448 and 450 may be implemented as one or more PMOS transistors. The transistors 444 and 446 may be implemented as one or more NMOS transistors. However, other types and polarity transistors may be implemented accordingly to meet the design criteria of a particular application. The device 442 is implemented as a resistive circuit. In one embodiment, the device 442 may be implemented as a resistor having a predetermined resistance R1.

The signal VBIAS is supplied to a source of transistor 440. The signal VREF is supplied to a gate of transistor 440. A drain of transistor 440 may be coupled to a first terminal of device 442. The signal VPTAT is supplied at the drain of transistor 440. A second terminal of the device 442 is connected to the voltage supply ground potential VSS. Transistor 440 will generally pass a current equal to the current I in response to the signals VREF and VBIAS. By passing the current I (where I=n*Vt*ln(B)/R, n is the emission coefficient, B is the ratio of diode areas of the devices 420 and 422, R is a predetermined resistance, and Vt is a thermal voltage) through the resistance R1, a voltage may be generated, as shown in the following equation 2:

$$VPTAT = I \cdot R1 = \frac{n \cdot Vt \cdot \ln(B)}{R} = \frac{n \cdot k \cdot \ln(B)}{q} \cdot \frac{R1}{R} \cdot T \qquad \text{Eq. 2}$$

When the current I is passed through device 442, the signal VPTAT is generated having a voltage level equal to ln(B) times Vt times R1/R. The voltage level of the signal VPTAT is generally proportional to absolute temperature and may be scaled by selecting the ratio R1/R.

The signal VPTAT is supplied to a gate of transistor 444. A source of the transistor 444 and a gate of transistor 448 are connected to the voltage supply ground potential VSS. A drain of the transistor 444 is connected to a source of transistor 446. A gate of transistor 446 is connected to the supply voltage VCC. A drain of the transistor 446 is connected to a drain of transistor 448. A source of transistor 450 is connected to the supply voltage VCC. A node 452 is formed by connecting a source of the transistor 448 with a drain and a gate of transistor 450. The signal PCTR may be supplied at the node 452. The signal PCTR is a mirror of the signal VPTAT.

Figure 5:
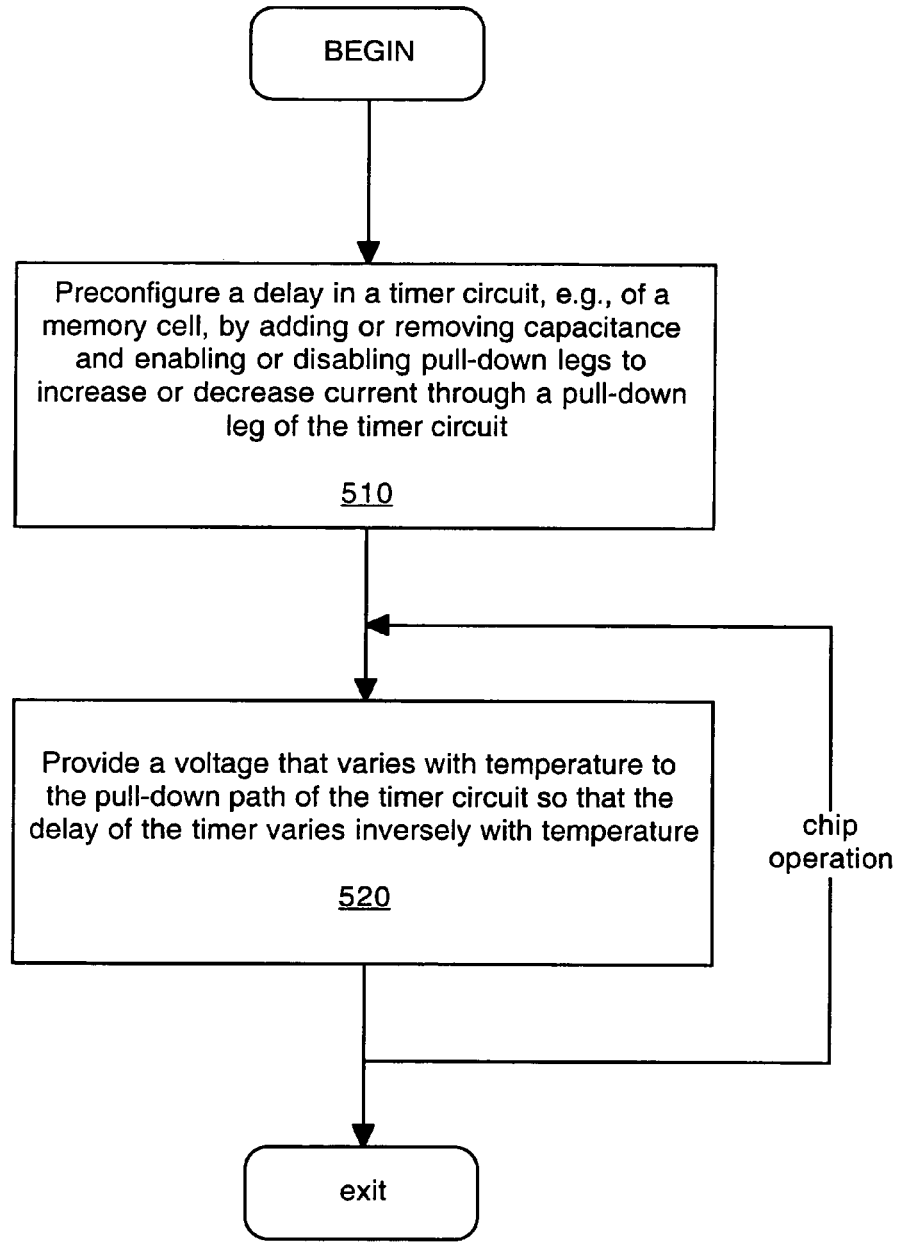
FIG. 5 is a flow diagram of a method for using the novel timer circuit having a delay that is inversely proportional to temperature, in accordance with one embodiment of the present invention.

FIG. 5 is a flow diagram of a process 500 for using the novel timer circuit 305 for generating a delayed version of a timing signal during the operation of a device, e.g., a memory device, in accordance with one embodiment of the present invention. At step 510 of process 500, a delay in a timer circuit is preconfigured by the addition or removal of programmable delay elements (e.g., capacitors 324 and 330 of FIG. 3) and programmable pull-down legs (e.g., leg 360 of FIG. 3) of the timer circuit.

The timer circuit may be used to control access functions of a memory device, such as a dynamic random access memory (DRAM). If there is more margin to latching data than is necessary, the delay of the timer could be shortened by, for example, removing capacitance, according to an embodiment of the present invention. This might be accomplished through either programming a passgate (e.g., passgate 320 of FIG. 3) or through metal trim options (e.g., by removing capacitor 330 of FIG. 3). Alternatively, if there were insufficient margin for latching data, the delay could, according to one embodiment, be increased by adding capacitance.

According to another embodiment, in addition to the above, in order to shorten the delay, the current could be increased by the addition of pull-down legs to the pull down path (e.g., pull-down leg 360 of pull-down path 342). This may be accomplished through programmable gates, such as 323a, 323b, 323c and 323d of FIG. 3. The adjustments to the timer as described in step 510 may be based on trial and error experimentation and may be done on a chip-by-chip basis. Once the capacitance and current are established for a given timer, they may be enforced by memory cells which control the configuration settings.

During operation, at step 520, a reference voltage (e.g., VPTAT 380 of FIG. 3) is provided to the pull-down path of the timer. The reference voltage varies with the absolute temperature of the timer device, and the timer circuit generates a delay in the control signal (e.g., signal 390 of FIG. 3) that varies inversely with temperature. Therefore, during operation of the memory device, the time delay may be adjusted dynamically to compensate inversely to changes in temperature of the memory device.

The delayed version of the control signal may be used to enable a cell write back time in a memory device. The delayed version of the control signal may also be used to enable a sense amplifier after a wordline activation in the memory device, or to enable a column select line after a sense amplifier activation in the device. The delayed version of the control signal may also be appropriate to control a refresh oscillator frequency in the memory device. All of the above are dependent on a constant time delay and are sensitive to the effects of temperature changes in the memory device.

The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A timer circuit comprising:
    an output stage coupled to a configurable delay element, wherein said configurable delay element comprises a plurality of selectively-activated components operable to adjust a delay through said timer circuit; and
    a pull-down path coupled to said output stage and comprising a first circuit configured to provide a selectable amount of pull down current for varying said delay through said timer circuit, wherein said first circuit comprises a plurality of individually-configured components, wherein said plurality of selectively-activated components are of a different component type than said plurality of individually-configured components, said pull-down path further comprising a second circuit for varying said delay through said timer circuit based upon temperature, wherein said second circuit is operable to vary said delay based upon a reference signal, wherein said reference signal varies said pull-down current, and wherein said delay is inversely proportional to said temperature.

2. A timer circuit as described in claim 1, wherein said reference signal is derived from a band gap reference circuit.

3. A timer circuit as described in claim 1, wherein said plurality of individually-configured components of said first circuit are placed in a fixed state during a configuration of said timer circuit before operation of said timer circuit.

4. A timer circuit as described in claim 1, wherein said plurality of selectively-activated components comprise a plurality of gated capacitors which can be selectively coupled to said output stage via a plurality of corresponding pass gates.

5. A timer circuit as described in claim 4, wherein said configurable delay element further comprises a plurality of configuration bits each for controlling a respective pass gate.

6. A timer circuit as described in claim 1, wherein said plurality of individually-configured components comprise a plurality of gated pull-down circuits coupled in parallel, and wherein each gated pull-down circuit comprises a first transistor having a gate controlled by a respective configuration bit and a series coupled second transistor having a gate controlled by said reference signal.

7. A timer circuit as described in claim 4, wherein said plurality of individually-configured components comprise a plurality of gated pull-down circuits coupled in parallel, and wherein each gated pull-down circuit comprises a first transistor having a gate controlled by a respective configuration bit and a series coupled second transistor having a gate controlled by said reference signal.

8. A timer circuit as described in claim 6, wherein said plurality of selectively-activated components comprise a plurality of gated capacitors which can be selectively coupled to said output stage via a plurality of corresponding pass gates.

9. A timer circuit as described in claim 8, wherein said configurable delay element further comprises a plurality of configuration bits each for controlling a respective pass gate.

10. An electronic device comprising a timer circuit and wherein said timer circuit comprises:
    an output stage coupled to a configurable delay element, wherein said configurable delay element comprises a plurality of selectively-activated components operable to adjust a delay through said timer circuit; and
    a pull-down path coupled to said output stage and comprising a first circuit configured to provide a selectable amount of pull down current for varying said delay through said timer circuit, wherein said first circuit comprises a plurality of individually-configured components, wherein said plurality of selectively-activated components are of a different component type than said plurality of individually-configured components, said pull-down path further comprising a second circuit for varying said delay through said timer circuit based upon temperature, wherein said second circuit is operable to vary said delay based upon a reference signal, wherein said reference signal varies said pull-down current, wherein said delay is inversely proportional to said temperature, and wherein said reference signal is derived from a band gap reference circuit.

11. An electronic device as described in claim 10, wherein said reference signal is a VPTAT voltage signal.

12. An electronic device as described in claim 10, wherein said plurality of selectively-activated components comprise a plurality of gated capacitors which can be selectively coupled to said output stage via a plurality of corresponding pass gates.

13. An electronic device as described in claim 10, wherein said plurality of individually-configured components comprise a plurality of gated pull-down circuits coupled in parallel, wherein each gated pull-down circuit comprises a first transistor controlled by a respective configuration bit and a series coupled second transistor having a gate controlled by said reference signal.

14. An electronic device as described in claim 13, wherein said plurality of selectively-activated components comprise a plurality of gated capacitors which can be selectively coupled to said output path via a plurality of corresponding pass gates.

15. An electronic device as described in claim 10, wherein said electronic device is a memory circuit.

16. An electronic device as described in claim 10, wherein said electronic device is a write back timer of a memory circuit.

17. A method of varying a delay of a timer circuit comprising:
during configuration of said timer circuit, setting a first plurality of configuration bits which control the amount of elements coupled to an output stage of said timer circuit to set an amount of delay through said timer circuit;
during said configuration, setting a second plurality of configuration bits which control an amount of pull down current through a pull down path of said timer circuit to set an amount of delay through said timer circuit, said pull down path coupled to said output stage, wherein said pull down path comprises a plurality of individually-configured components, and wherein each of said plurality of individually-configured components corresponds to a respective configuration bit of said plurality of configuration bits; and
during operation of said timer circuit, varying said delay of said timer circuit in response to a varying of a reference signal, wherein said reference signal varies said pull-down current, wherein said delay of said timer circuit is inversely proportional to a temperature of said timer circuit.

18. A method as described in claim 17 wherein said reference signal is generated by a band gap circuit and varies proportionally with said temperature.

19. A method as described in claim 18 wherein said plurality of individually-configured components comprise a plurality of parallel coupled pull down circuits, each pull down circuit comprising a first transistor coupled to a respective configuration bit of said second set of configuration bits and a second transistor having a gate coupled to said reference signal.

20. A method as described in claim 19 wherein said elements are gated capacitors which can be selectively coupled to said output stage based on said first set of configuration bits.

* * * * *